United States Patent [19]
Nishida et al.

[11] 4,226,827
[45] Oct. 7, 1980

[54] METHOD FOR PREPARING PIEZOELECTRIC CERAMICS

[75] Inventors: Masamitsu Nishida, Osaka; Syunichiro Kawashima, Nishinomiya; Ichiro Ueda, Osaka; Hiromu Ouchi, Toyonaka, all of Japan

[73] Assignee: Matsushita Electric Industrial Co., Ltd., Osaka, Japan

[21] Appl. No.: 67,681

[22] Filed: Aug. 20, 1979

[30] Foreign Application Priority Data

Aug. 23, 1978 [JP] Japan ................... 53-103023
Aug. 23, 1978 [JP] Japan ................... 53-103024

[51] Int. Cl.² .......................................... C04B 35/36
[52] U.S. Cl. ................................. 264/332; 252/62.9
[58] Field of Search ..................... 264/332; 252/62.9

[56] References Cited
U.S. PATENT DOCUMENTS

3,372,121 3/1968 Banno .................................. 252/62.9
3,671,765 6/1972 Hardtl ................................. 252/62.9

*Primary Examiner*—John A. Parrish
*Attorney, Agent, or Firm*—Stevens, Davis, Miller & Mosher

[57] ABSTRACT

A piezoelectric ceramic elements obtained by hot-press sintering a composition expressed by the formula:

$$(1-w)PbTi_{1-z}Zr_zO_3 + wMnO_2$$

at a temperature of 1050° to 1300° C. under a pressure of 100 to 500 Kg/cm² for 0.5 to 24 hours shows a mechanical quality factor of 200 or more and a Poisson's ratio of more than $\frac{1}{3}$ and gives a piezoelectric material having a large coupling coefficient which can be processed into a thin sheet having a thickness of 30 μm and is especially suitable as a material for resonators and filters by utilizing its thickness extensional vibration.

4 Claims, 4 Drawing Figures

F I G. 1
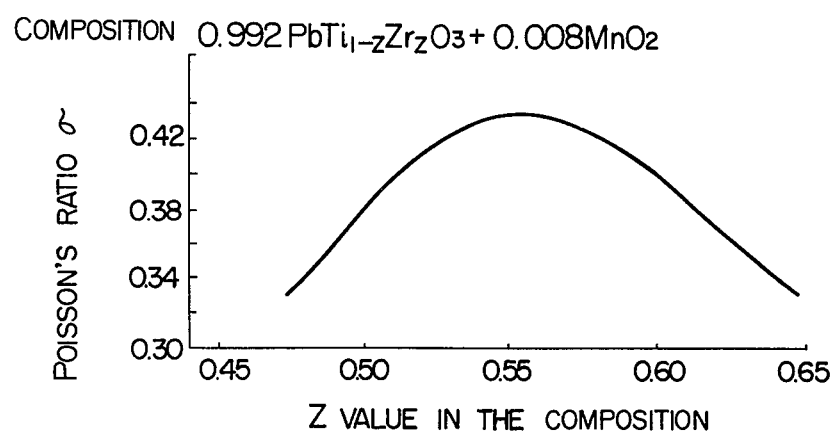
F I G. 2
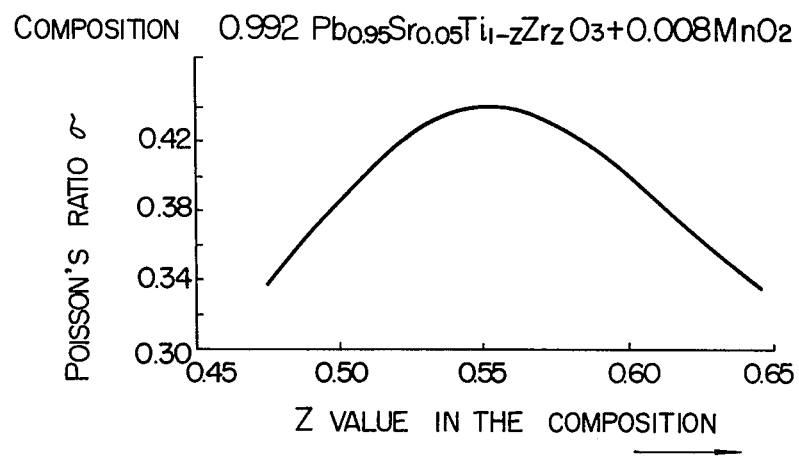

COMPOSITION $(1-W)(PbTi_{0.4}Zr_{0.6}O_3) + WMnO_2$

COMPOSITION $(1-W)Pb_{0.9}Ba_{0.1}Ti_{0.4}Zr_{0.6}O_3 + WMnO_2$

METHOD FOR PREPARING PIEZOELECTRIC CERAMICS

The present invention relates to a process for producing piezoelectric ceramics. More particularly, the present invention relates to a piezoelectric ceramic material which is suitable for use in a high frequency resonator composed of an energy trapping resonator using thickness extensional vibration, and which has large values in both its mechanical quality factor $Q_M$ and in its electromechanical coupling coefficients $k_t$ and $k_{33}$ and can be processed into a thin sheet.

Recent wide spread use has caused a strong demand for high effectiveness as well as solidification and no need for adjustment of the circumferential parts of the IC-circuit, especially of the reactance circuit. It is expected that the piezoelectric ceramic resonator will be able to satisfy this requirements.

When using piezoelectric ceramic for a high frequency resonator, it is advantageous to utilize its thickness vibration whose frequency is determined by its thickness, especially thickness extensional vibration. Since the frequency constant of thickness extensional vibration is about 2000 Hz.m, a ceramic resonator with a thickness as thin as about 40 μm is required to obtain a frequency of 50 MHz. A requirement for making use of thickness extensional vibration in a resonator or filter is the removal of unnecessary resonances. For the removal of unnecessary resonances, the energy trapping method is highly effective. In order to apply the energy trapping method thereto, it is necessary that the value of the Poisson's ratio $\sigma$ given by the formula, $$\sigma = (2 - C_{33}^D \cdot S_{44}^E)/(2 - 2C_{33}^D \cdot S_{44}^E)$$

(wherein $C_{33}^D$ is the elastic stiffness associated with thickness extensional vibration and $S_{44}^E$ is an elastic compliance associated with thickness shear vibration) is greater than ⅓. Furthermore, it is necessary that the mechanical quality factor be much higher than 200 (to obtain a resonator having a small loss in the high-frequency region).

By the conventional sintering method, only a mechanically weak ceramic body has been obtained, but it cannot be processed into an element having a thickness less than 200 μm. Therefore, a resonator having a resonance frequency above 10 MHz has been difficult to obtain by utilizing thickness extensional vibration.

Heretofore, there has scarcely been any resonator whose Poisson's ratio has been determined. Therefore, the composition for obtaining a resonator having a Poisson's ratio over ⅓ has never been disclosed. Until now, material has not been found which has a mechanical quality factor of about 200 or more and a Poisson's ratio of ⅓ or more and, further, is easily processable into a thickness of less than 200 μm.

The object of the present invention is to provide a process for preparing piezoelectric ceramic material for high-frequency use having a large coupling-coefficient which has a Poisson's ratio of more than ⅓ and a mechanical quality factor of 200 or more and is processable into a thin sheet having a thickness of about 30 μm.

According to the method of the present invention, the piezoelectric ceramic material can be obtained by hot-press sintering for 0.5 to 20 hours at a temperature of 1050° to 1300° C. and under a pressure of 100 to 500 kg/cm², a composition having the formula, $$(1-w)(PbTi_{1-z}Zr_zO_3) + wMnO_2$$

(wherein $0.48 \leq z \leq 0.64$, $0.004 \leq w \leq 0.06$) and the parts of 10% or less of Pb may be substituted with one or more of the elements selected from the group consisting of Sr, Ca and Ba. More specifically, the present invention provides a method for preparing a piezoelectric ceramic body wherein the starting material prepared according to the above formulation are mixed, and wet-mixed in a ball-mill, filtered and dried, and then the mixture is subjected to calcination. Then the product is wet-ground, filtered, dried and shaped, and then hot-press sintered for 0.5 to 24 hours at a temperature of 1050° to 1300° C. under a pressure of 100 to 500 kg/cm².

FIG. 1 and FIG. 2 are diagrams showing the relation between the Poisson's ratio and the composition of piezoelectric ceramics prepared according to the present invention.

Figure 3:
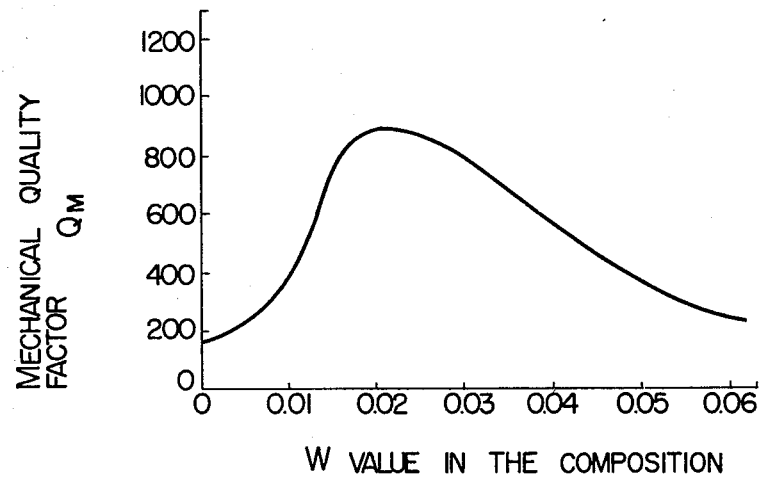
FIG. 3 and FIG. 4 are diagrams showing the relation between the mechanical quality factor $Q_M$ and the composition of the piezoelectric ceramics prepared by the present invention.

The present invention will now be explained by way of example in the following description for the purpose of illustration only without any intention of imposing any limitation on the invention defined by the claims.

EXAMPLE

The raw materials of PbO, TiO₂, ZrO₂, MnO₂, SrCO₃, CaCO₃ and BaCO₃ were weighed in accordance with the formulation shown in Tables 1 and 2, and wet-mixed for 17 hours in a ball-mill. The obtained slurry was filtered and dried and then calcinated for 2 hours at about 850° C. The obtained material was then pulverized, dried and shaped into discs each having a diameter of 30 mm and a thickness of 17 mm under a pressure of 500 kg/cm². Then, the discs were hot-press sintered under the conditions shown in Tables 1 and 2. Next, the obtained disc ceramics were subjected to anneal-treatment for 4 hours at 900° C. For the sake of comparison, a powder prepared according to the same method as mentioned above was sintered in the conventional method. Disc samples having a diameter of 6 mm were then cut off from the sintered material and then an attempt was made to polish them into a minimum thickness of 30 μm. However the sample obtained by the conventional method was mechanically weak and broken before they could be polished to the thickness of 30 μm, and so thin sheet elements having the desired thickness could not be obtained. The piezoelectric properties of the samples prepared according to the present invention were measured by attaching electrodes onto the sample elements having a thickness of 0.3 mm and impressing a direct current field of 5 KV/mm in a silicon oil having a temperature of 160° C. Longitudinal coupling coefficient $k_{33}$ was determined using a rod sample having a dimension of 5×1×1 mm³.

In Tables 1 and 2, the relationship between the sintering condition and the polishing limit is shown. Although a ceramic having the maximum density in the case of the conventional sintering, is obtained under the sintering condition shown in Tables 1 and 2, the obtained sample could not be polished to the thickness of 200 μm or less. On the other hand, in accordance with hot-press sintering of the present invention, a very thin ceramic element could be obtained. The sample hot-pressed at a temperature of 1050° to 1300° C., could be polished to a thickness of 30 μm. In the case of hot-press sintering under a pressure of less than 100 kg/cm², a deficient sintering resulted, thereby producing a heterogeneous sample and polishing the sample to a thickness of 200 μm or less was different. The hot-press sintering under a pressure range of 100 to 500 kg/cm² led to a satisfactory ceramic polishable to the extent of a thickness of 30 μm. As for the sintering time, a sintering of less than 0.5 hour is insufficient for obtaining a fully sintered product and resulted in heterogeneous products which could not be polished to a thin ceramic sheet having a thickness of 100 μm or less. However, a sintering of 24 hours or more is not desirable because it produced a mechanically weak ceramic and furthermore results in a low producibility. Accordingly, the hot-press sintering according to the present invention is preferably carried out at a temperature of 1050° to 1300° C. under a pressure of 100 to 500 kg/cm² for 0.5 to 24 hours.

Table 2 shows an example of the polishing limit of ceramics when replacing a part of Pb with Sr and similar results were obtained replacing a part of Pb with Ba or Ca.

TABLE 1

Composition: 0.992 (PbTi$_{0.44}$Zr$_{0.56}$O$_3$) + 0.008MnO$_2$

| Sintering method: | Temp. (°C.) | Pressure (Kg/cm²) | Time (hours) | Polishing limit (μm) |
|---|---|---|---|---|
| Conventional sintering | 1250 | — | 2 | 200 |
| Hot-Press sintering | 1330 | 200 | 2 | 140 |
|  | 1300 | 200 | 0.5 | 30 |
|  | 1250 | 200 | 4 | 30 |
|  | 1100 | 300 | 2 | 30 |
|  | 1050 | 300 | 24 | 30 |
|  | 1000 | 300 | 2 | 180 |

TABLE 2

Composition: 0.992 (Pb$_{0.95}$Sr$_{0.05}$Ti$_{0.44}$Zn$_{0.56}$O$_3$) + 0.008MnO$_2$

| Sintering method | Temp. (°C.) | Pressure (Kg/cm²) | Time (hours) | Polishing limit (μm) |
|---|---|---|---|---|
| Conventional sintering | 1250 | — | 2 | 200 |
| Hot-Press sintering | 1330 | 200 | 2 | 120 |
|  | 1300 | 200 | 0.5 | 30 |
|  | 1250 | 200 | 4 | 30 |
|  | 1100 | 300 | 2 | 30 |
|  | 1050 | 300 | 24 | 30 |
|  | 1000 | 300 | 2 | 160 |

In FIG. 1 is shown the relationship between the Poisson's ratio $\sigma$ and various values of Z in ceramic samples having a composition expressed by the formula (0.992 PbTi$_{1-z}$Zr$_z$O$_3$ + 0.008 MnO$_2$) which composition was sintered at a temperature of 1250° C. under a pressure of 200 kg/cm² for 4 hours. As seen from FIG. 1, the Poisson's ratio shows the maximum value when z is 0.55. At the time, the k$_t$ and k$_{33}$ show large values, 0.54 and 0.68, respectively. The energy trapping condition of the fundamental wave, namely $v > \frac{1}{3}$, is satisfied, in the composition range of $$0.48 \leq z \leq 0.64$$

in the case that w is equal to 0.008. Furthermore, in the case that w is in a range of 0.004 to 0.006, the condition of $v > \frac{1}{3}$ is also satisfied within the range of z mentioned above.

In FIG. 2 is shown the relation between the Poisson's ratio and various values of z in ceramic samples having a composition expressed by the formula:

$$0.992 \, Pb_{0.95}Sr_{0.05}Ti_{1-z}Zr_zO_3 + 0.008 \, MnO_2$$

which composition was sintered at a temperature of 1250° C., under a pressure of 200 kg/cm² for 4 hours. The Poisson's ratio $\sigma$ has its maximum value when z is 0.55. At that time, k$_t$ and k$_{33}$ show the large value, 0.55 and 0.70, respectively. The range of z within which the energy trapping condition of the fundamental wave, namely $\sigma > \frac{1}{3}$, is satisfied, is in a composition range of $$0.48 \leq z \leq 0.64$$

in the case of a composition wherein 5 atom percentage of Pb is substituted with Sr. The condition of $\sigma > \frac{1}{3}$ can be satisfied by a composition wherein a part of Pb is substituted with Ba or Ca.

In FIG. 3 is shows a curve showing the relationship between mechanical quality factor Q$_M$ and various values of w on a sample (z=0.60) hot-press sintered at a temperature of 1250° C. under a pressure of 200 kg/cm² for 4 hours. Q$_M$ shows its maximum value when w is 0.02. Furthermore, the Q$_M$ of ceramics exhibits 200 or more, in the value of w being in a range of 0.004 to 0.06.

Figure 4:
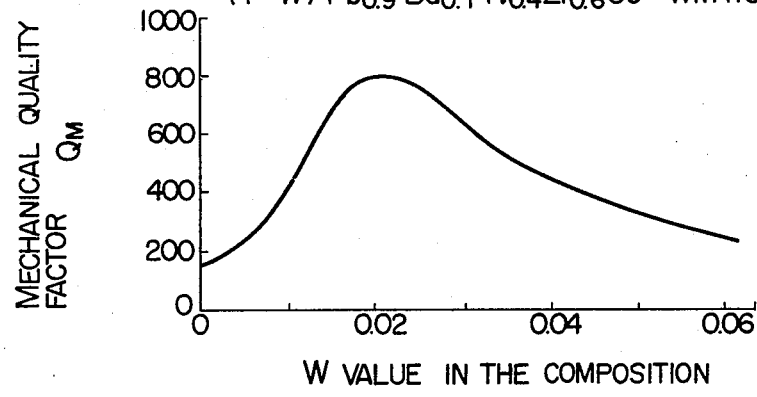

In FIG. 4 is shown the relation between w and the mechanical quality factor Q$_M$ of the sample (z=0.60, 10 atom percent of Pb was replaced by Ba) hot-press sintered at a temperature of 1250° C., under a pressure of 200 kg/cm² for 4 hours. Q$_M$ shows its maximum value when w is 0.02. The value of w obtaining a value of Q$_M$ of 200 or more is within the range of 0.004 to 0.06. Furthermore, when 10 atom percentage or more of Pb is replaced with Sr, Ba or Ca, the value of k$_t$ is lowered exessively and thus the replacement of Pb was limited to an amount less than 10 atom percentage.

What is claimed is:

1. Process for preparing a piezoelectric ceramic body which comprises hot-press sintering a composition expressed by the formula:

$$(1-w)(PbTi_{1-z}Zr_zO_3) + wMnO_2$$

wherein z and w satisfy respectively the formulae: $0.48 \leq z \leq 0.64$ and $0.004 \leq w \leq 0.06$, at a temperature of 1050° to 1300° C. under a pressure of 100 to 500 kg/cm² for 0.5 to 24 hours.

2. Process for preparing a piezoelectric ceramic body which comprises mixing a composition expressed by the formula:

$$(1-w)(PbTi_{1-z}Zr_zO_3) + wMnO_2$$

wherein z and w satisfy the relations:

$$0.48 \leq z \leq 0.64 \text{ and } 0.004 \leq w \leq 0.06,$$

calsinating, pulverizing, shaping and hot-press sintering the obtained material at a temperature of 1050° to 1300° C. under a pressure of 100 to 500 kg/cm² for 0.5 to 24 hours.

3. Process for preparing a piezoelectric ceramic body which comprises hot-press sintering a composition expressed by the formula:

$$(1-w)(PbTi_{1-z}Zr_zO_3) + wMnO_2$$

wherein z and w satisfy the relations:

$0.48 \leq z \leq 0.64$ and $0.004 \leq w \leq 0.06$, and wherein 0 to 10 atom percentage (except for 0 percentage) of Pb is substituted with one or more selected from the group consisting of Sr, Ca and Ba, at a temperature of 1050° to 1300° C., under a pressure of 100 to 500 kg/cm² for 0.5 to 24 hours.

4. Process for preparing a piezoelectric ceramic body which comprises mixing a composition expressed by the formula:

$$(1-w)(PbTi_{1-z}Zr_zO_3) + wMnO_2$$

wherein z and w satisfy the relations:

$0.48 \leq z \leq 0.64$ and $0.004 \leq w \leq 0.06$, and wherein 0 to 10 atom percentage (except for 0 percentage) of Pb is substituted with one or more selected from the group consisting of Sr, Ca and Ba, calcinating, pulverizing, shaping and hot-press sintering the obtained material at a temperature of 1050° to 1300° C. under a pressure of 100 to 500 kg/cm² for 0.5 to 24 hours.

* * * * *